United States Patent [19]

Hazel

[11] 3,960,309

[45] June 1, 1976

[54] FINE WIRE TWISTED PAIR ROUTING AND CONNECTING SYSTEM

[75] Inventor: Herbert Kenneth Hazel, Poughkeepsie, N.Y.

[73] Assignee: International Business Machines Corporation, Armonk, N.Y.

[22] Filed: July 31, 1974

[21] Appl. No.: 493,371

[52] U.S. Cl............................. 228/5.1; 140/93 R; 219/56; 219/85; 228/1; 228/7
[51] Int. Cl.²......................................... B23K 1/20
[58] Field of Search ................ 228/5, 15, 7, 13, 18, 228/44, 1, 3, 4; 140/93; 29/203 D, 203 R, 203 MW, 203 R, 628; 219/56, 57, 85 F

[56] References Cited
UNITED STATES PATENTS

| | | | |
|---|---|---|---|
| 3,103,735 | 9/1963 | Bos et al............................ | 29/203 P |
| 3,646,307 | 2/1972 | Hazel................................. | 219/85 F |
| 3,769,699 | 11/1973 | Bennett et al...................... | 140/93 R |
| 3,773,240 | 11/1973 | Heim ............................ | 29/203 MW |

Primary Examiner—C. W. Lanham
Assistant Examiner—James R. Duzan
Attorney, Agent, or Firm—Joscelyn G. Cockburn; John G. Wynn

[57] ABSTRACT

Apparaus for automatically bonding pre-twisted wires to a number of pairs of ground and current contact points on a workpiece or substrate is disclosed. The apparatus forms a loop in the pre-twisted wires and bonds each wire to a ground or current contact point. The pre-twisted wire is then routed to the next pair of ground and current contact point for bonding.

3 Claims, 13 Drawing Figures

FINE WIRE TWISTED PAIR ROUTING AND CONNECTING SYSTEM

BACKGROUND OF THE INVENTION

1. Field of the Invention

This invention relates to an apparatus for automatically connecting and routing wire elements between two or more terminals on a base or workpiece.

2. Prior Art

It is common practice in automatic wiring apparatus to feed double strands of wires from a feed unit for bonding to a first and a second bond point on a card. Each bond point has ground and signal pads to which each of the wires is bonded. Prior to bonding, the insulations from the wires are stripped; a bonding unit then engages the wires and bonds said wires to the ground and signal pads, respectively.

After bonding the wires to the first bond point, the exact distance between the first and second bond point is determined. Wire lengths, equivalent to this distance are fed from wire spools and a wire twisting assembly twists said wires. The card is then positioned so that the second bonding point is within reach of the bonding unit. The stripping process is again performed and the wires are bonded to the second point. The wires are then broken off adjacent to the second bond point, thus completing a net.

Although the prior art wiring systems are satisfactory for their intended purposes, these systems are not suitable for high speed operation. As a result, a relatively long period of time is required to complete a net, i.e., bond a pair of wires to a first bond point on a workpiece and route the twisted wire to a second bond point. In short, these prior art wiring systems are relatively slow. The slowness of these systems stems from the fact that the bonding process is divided into two steps, namely, stripping the insulation from the wires and then bonding the strip wires to the workpiece. The problem of slowness is further aggravated by the fact that the wires have to be twisted before routing to the second bonding point. Due to the slowness of these prior art wiring systems, there has been a significant increase in production cost.

Another significant disadvantage of the above wiring systems is that it can only wire relatively short nets. As a result of this deficiency, the system is effectively a point-to-point system, i.e., the length of a net (distance between the first and the second wiring point) is relatively short. In fact, the length of a net is in a direct line from the first to the second bond point. The restriction in the length of a net, stems from the fact that the feed tube wherein the wires are twisted can accommodate only a fixed length of twisted wires and if the distance between the bonding points exceed this fixed length, the system is useless. To meet this net restriction, after bonding the wires to a first bond point, the distance to the second bond point is determined and the wire is twisted prior to positioning the card for bonding at the second bond point. However, it is well known to technicians in the wiring art that in some wiring applications, e.g., wiring a second level package (i.e., a package containing a plurality of cards) relatively long nets are required, and to meet this need, the prior art wiring systems are inadequate.

Another disadvantage of the prior art wiring systems is that after bonding the wires to a first bond point, the system cannot route twisted wires, through channels and around guide posts affixed to a second level package or workpiece, to the second bond point. As is well known in the wiring art, a second level package contains a multiplicity of wires. In order to maintain these wires in an orderly fashion, channels and guide posts are affixed to the second level workpiece to maintain these wires in, respective, geometrical patterns. It is therefore necessary to have a wiring system which is capable of wiring and routing the wires on such second level workpiece. However, in spite of efforts to improve the routing capabilities of the prior art wiring systems, the problem has not been solved.

Finally, the prior art wiring systems generally do not orientate the position of the ground and signal wire so as to obtain alignment with the ground and signal pads on a workpiece. It is not uncommon in the wiring art to find that the orientation between the ground and signal pads on a workpiece at a first bond site is different from the orientation at a second bond site, i.e., at a first bond point the signal pad is to the right of the ground pad while at a second bond point the signal wires is to the left of the ground pad. In order to maintain proper alignment between the ground wire and the ground pad, and the signal wire and the signal pad, the orientation of the wires must be changed. The prior art wiring systems generally do not change the orientation of the ground and signal wires and therefore, this creates an undue restriction in preparing the signal and ground pads on a workpiece to be used with the prior art wiring systems.

OBJECTS OF THE INVENTION

It is, therefore, an object of this invention to bond and route pre-twisted wires on a workpiece in a more efficient and improved manner than was heretofore possible.

It is another object of this invention to bond and route relatively long lengths of pre-twisted wires, in channels, between bonding sites on a workpiece.

It is still a further object of this invention to bond a signal wire to left or right of the ground wire on a workpiece.

SUMMARY OF THE INVENTION

The present invention includes an automatic bonding and routing device wherein a feed unit feeds pre-twisted wires from a supply spool into the jaws of a receiving clamp. The receiving clamp grips the pre-twisted wires at a leading node. A loop is opened in the pre-twisted wires by gripping said wire at a succeeding node by the feed unit and rotating said feed unit in a direction opposite to the twisted pitch of the wires. A bonding unit, having spaced probes is provided for positioning and bonding the wires to ground and signal pads on a workpiece.

Under computer control, the twisted wire is routed from the first to the second bond point. The routing feature of the invention is achieved by moving the workpiece in a X-direction and moving a turret-head containing the tools in a Y- and circular direction.

Another feature of the invention provides means for bonding the signal wire to the right or left of the ground wire. Under computer control, the orientation of the ground and signal pads on the workpiece is determined. If the orientation of the ground and the signal wires, of the loop, is not in alignment with the ground and signal pad on the workpiece, the computer issues a signal which results in the opening of the jaws of the receiving clamps so that the pre-twisted wire is free at one end but grips at the other end by the feed unit. The feed unit is rotated 0°–180° so that the relative position of the ground and signal wires are reversed thus aligning said wires with the ground and the signal pad on the workpiece.

DETAILED DESCRIPTION

Figure 1:
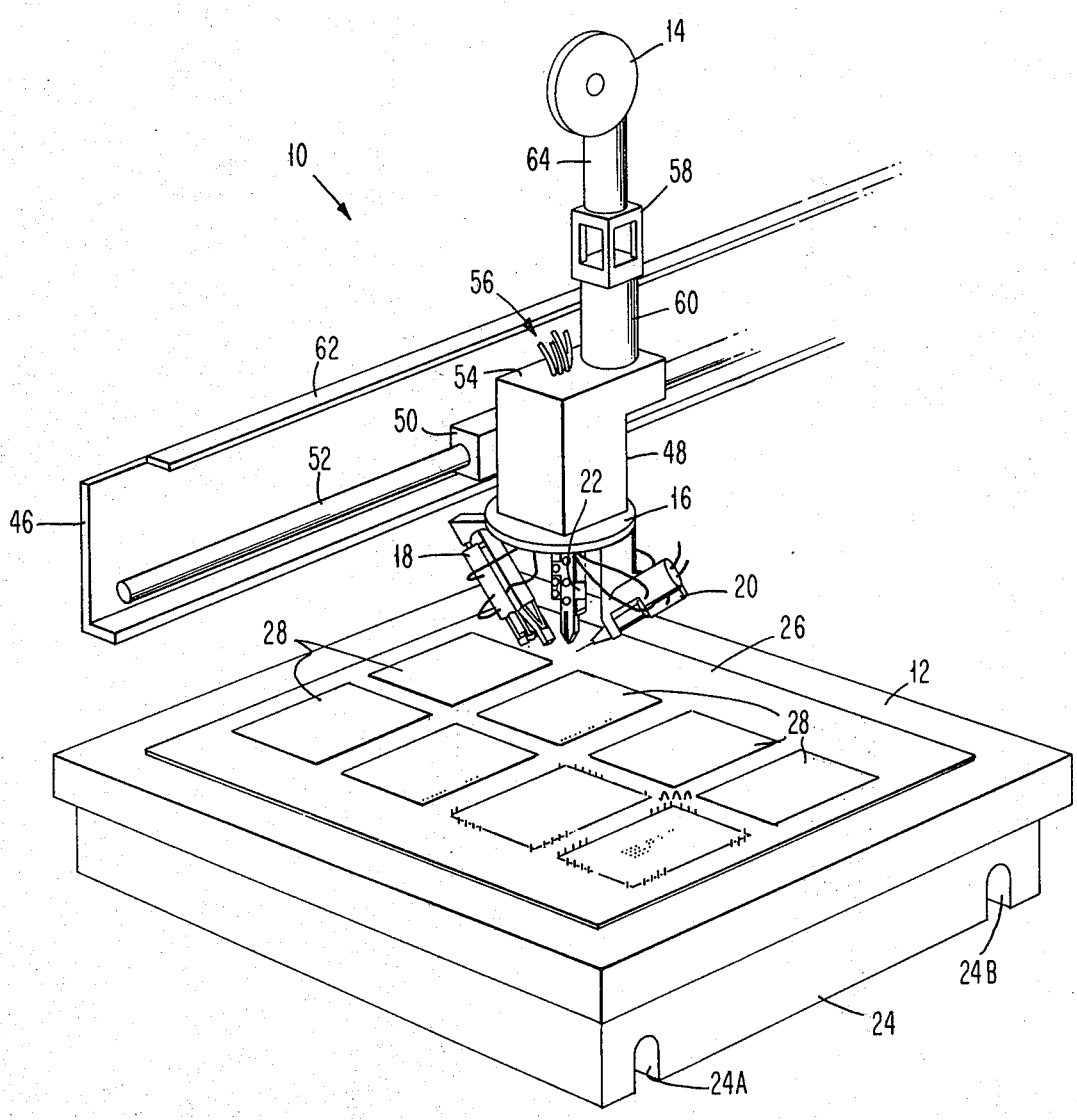
FIG. 1 is a perspective view of the preferred wiring apparatus of this invention.

Referring to FIG. 1, the apparatus generally comprises a frame 10, supporting a work-positioning mechanism generally designated 12; a wire spool with pre-twisted wire 14; a tooling base or turret 16; a receiving clamp 18; a feeding unit 20; and a bonding unit 22.

Still referring to FIG. 1, there is shown a standard numerical control X–Z positioning mechanism generally designated 12, such as those commonly in use for positioning machine tools and workpieces. Positioning mechanism 12 positions workpiece upon which pre-twisted wire is bonded. For example, application Ser. No. 75,033, now U.S. Pat. No. 3,646,307 of H. K. Hazel for "Wiring Apparatus" filed Sept. 24, 1970, and assigned to the assignee of this invention discloses a similar positioning mechanism. Positioning mechanism 12 is controlled by a program in a computer (not shown) and has a platform member 24 moveable along the X-axis (in opposite direction) along dove tails 24a and 24b, respectively. Also positioning mechanism 12 can move along the Z-axis (up and down).

Figure 5:
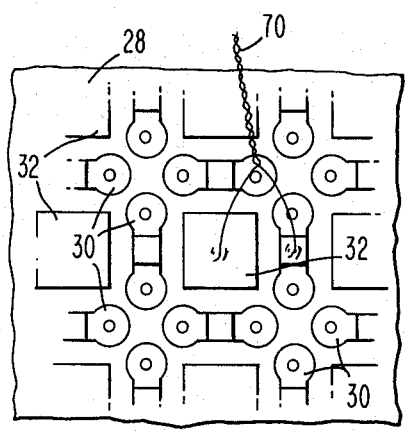
FIG. 5 is a top view of a workpiece showing signal and ground pads.

A second level workpiece 26 having a plurality of circuit cards 28 (FIGS. 5 and 6) is secured by any suitable means on positioning mechanism 12 and is arranged to be moved by platform member 24. As can be seen in FIG. 5, each circuit card 28 has a plurality of co-planar ground pads 20 and signal pads 32 affixed to a substrate. The distance (center to center) between the signal pad 32 and its associated ground pads 30 is fixed. The fixed distance between the signal pad 32 and the ground 30 enables bonding unit 22 which has a space bonding tip 314 (FIG. 4) to bond wires to the ground and signal pads. Both the ground pads 30 and the signal pads 32 are reflow solder pads. the use of reflow solder pads should not be construed as limiting the scope of the invention since other types of pads will be obvious to one skilled in the art. Also, the schematic of FIG. 5 is an enlarged diagram of the actual circuit card. In actual practice, since a large amount of circuitry has to be packed on circuit card 28, the ground and signal pads approaches microscopic size.

Figure 6:
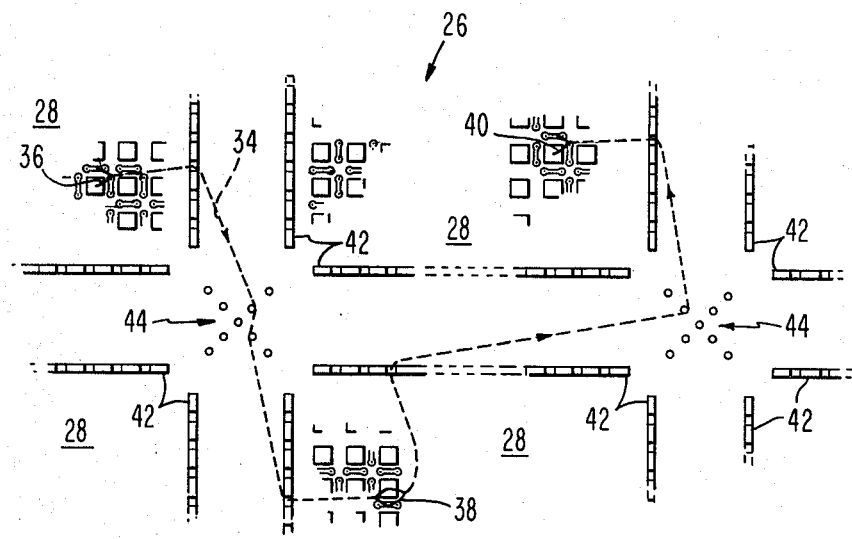
FIG. 6 is a more detailed top view of a workpiece showing bond sites and the routing of a complete net.

Now referring to FIG. 6, workpiece 26 is shown in greater detail with a plurality of circuit cards 28. A net 34 of pre-twisted insulated wire is shown joining bond points 36, 38 and 40, respectively. Although net 34 is routed to span several circuit cards, it is not inconceivable for a net to begin and terminate on the same card. Such a net would be called a "short net." Net 34 and bond points 36, 38, and 40 will be subsequently described. Affixed to workpiece 26 is a plurality of product guides with channels 42. The channels of product guide 42 maintain the routed nets in their respective geometries. Also, conering posts 44 are affixed to workpiece 26 to maintain pre-twisted wires in their respective geometries. It should be bore in mind that on miniturize workpiece 26, a large number of circuits are present. A large number of nets are, therefore, required to interconnect the various circuits. For example, net counts approaching the thousands are not inconceivable. It therefore becomes necessary to have means affixed to the workpiece to maintain the nets in some orderly manner.

Figure 10:
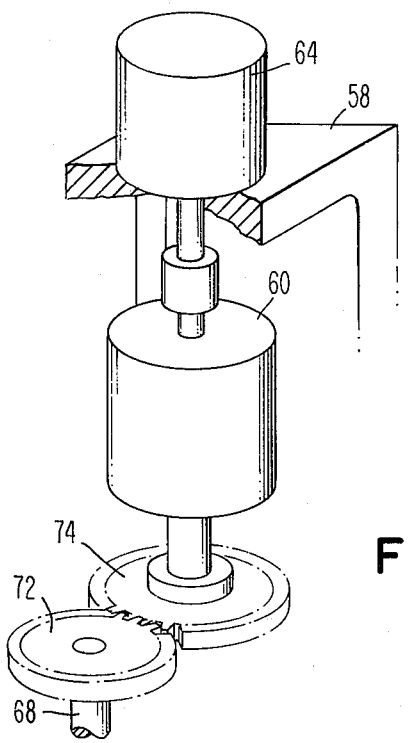
FIG. 10 shows the mechanism for rotating the tooling plate.

Referring again to FIG. 1, positioning mechanism 12 is driven by servo-motors (not shown) under the control of a programmable computer (not shown). As a result, positioning mechanism 12 positions workpiece 26 along the X- or Z-axes depending on the computer program. Attached to frame 10 is a horizontal track 46 at 90° to the X-axis. Turret 16, hereinafter called "tooling base," is interconnected by spindle 68 (FIGS. 2 and 10) to one-to-one gears 72 and 74, respectively. One-to-one gears 72 and 74 are located at the top of an elbow shaped carriage housing 48. The interconnecting spindle is driven by servo-motor 60 via one-to-one gears 72 and 74, thereby affecting circular motion of the tooling base. Servo-motor 60 is interconnected to encoder 64. The circular motion of tooling base 16 enables routing the pre-twisted wire from spool 14 between channels of product guides 42 and around post 44 (FIG. 6). Carriage housing 48 is journalled on carriage assembly 50 which is arranged to ride in opposite direction (along the Y-axis) along track 46. Carriage assembly 50 is suspended on linear bearing shaft 52 (hereinafter called main guide rod) via ball bushing 76. Main guide rod 52 runs parallel to horizontal track 46 and carriage assembly 50 rides on the shaft. Motion along shaft 52 is obtained by a lead screw and roller assembly. (See FIG. 11.) The lead screw and roller assembly is driven by a servo-motor and the combination will be described subsequently. Housing 48 connects tooling base with carriage assembly 50 and the overall combination has a Y-motion along horizontal track 46. Motion along horizontal track 46 allows the alignment of bonding unit 22 with predetermined bond sites on workpiece 26. The upper surface 54 of carriage housing 48 has a plurality of inlets 56 which are used for electrical wiring and pneumatic inlet. Rectangular support mechanism 58 is connected to carriage housing 48 by servo-motor 60. Encoder 64 is interconnected to support mechanism 58. On the backside of support mechanism 58 is an extension of carriage assembly 50 which contains a guide bearing block 78, (FIG. 11) which rides rectangular rail 62 (hereinafter called "upper guide rail") of horizontal track 46. Support mechanism 58 attaches wire spool 14 via a bracket (not shown) to the rest of the tooling system previously described; so that the carriage assembly 50 rides in opposite direction along linear shaft 52 and rectangular rail 62, of horizontal track 46, the entire tooling system moves. The tooling system is stabilized by main guide rod 52 and upper guide rail 62.

Figure 11:
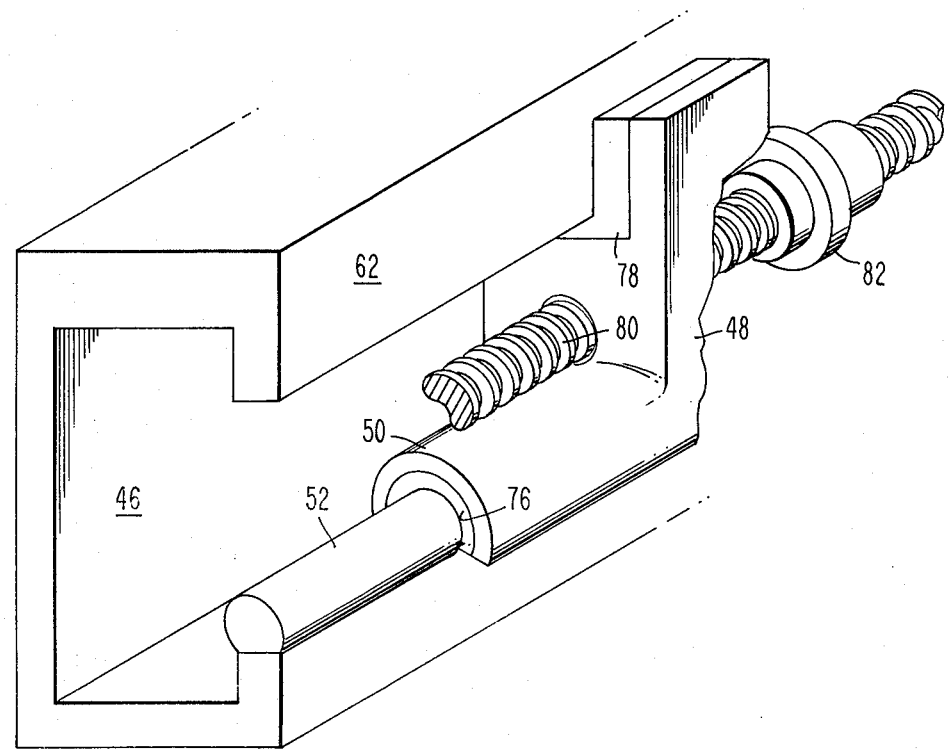
FIG. 11 depicts the lead screw assembly for motion in the Y-axis direction.

As was previously mentioned, motion in the Y-direction is achieved by a lead screw assembly. This assembly is depicted in FIG. 11. Lead screw 80 runs parallel to main guide rod 52. A servo-motor (not shown) rotates the lead screw. Ball nut 82 attaches to carriage housing 48. As the servo-motor (not shown) rotates lead screw 80, ball nut 82 travels along said screw and pulls carriage housing 48.

Figure 2:
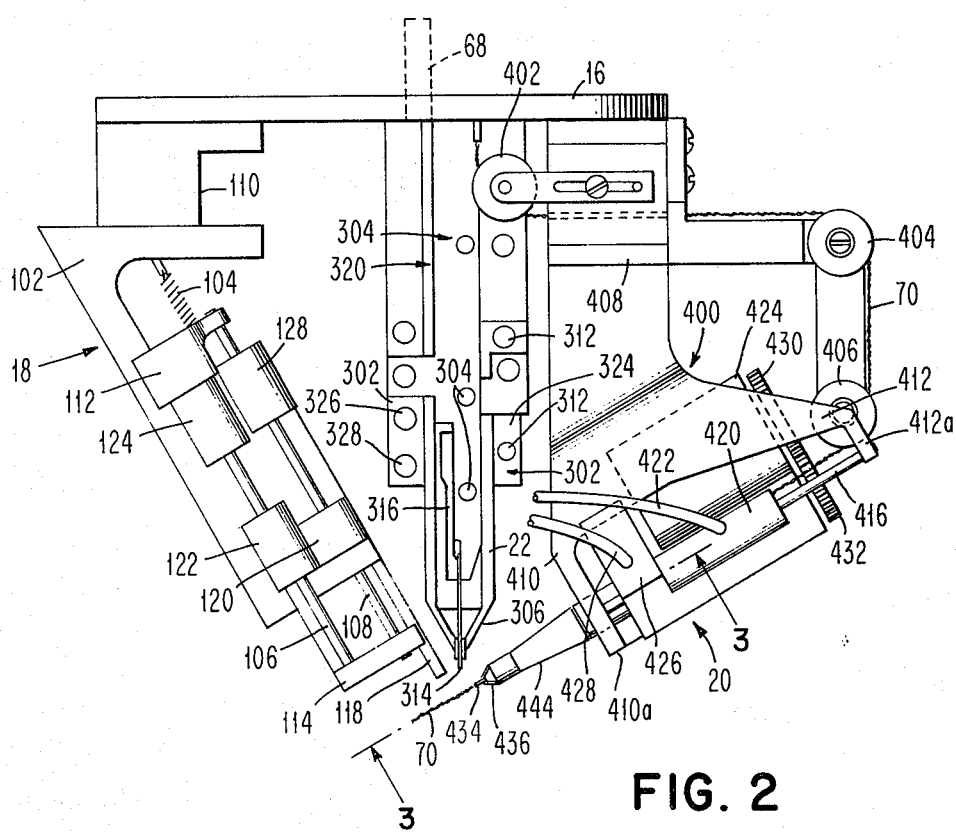
FIG. 2 is a front view of the tooling base and attached tools.
Figure 7A:
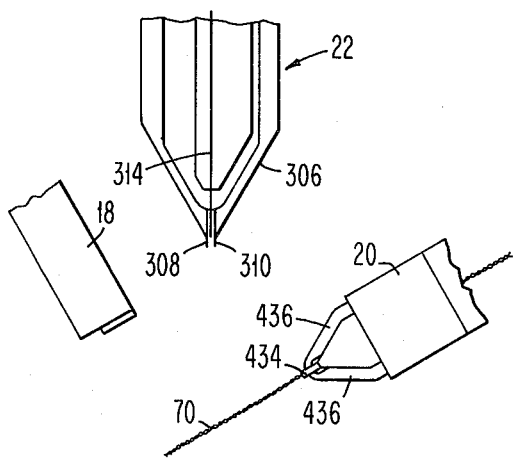
FIG. 7a shows the apparatus with the receiving clamp and the bonding tool in the home position while the feeding tool pre-twists the wire prior to forming a loop.
Figure 7B:
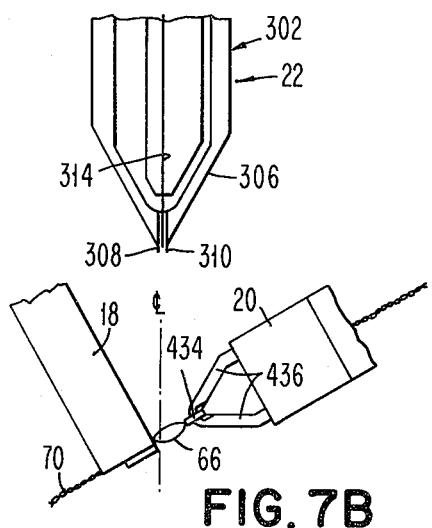
FIG. 7b shows the apparatus with the bonding tool in the home position while the receiving clamp and the feeding tool form the loop.

Now referring to FIG. 2 is an enlarged front view of tooling base 16, receiving clamp 18, hereinafter called "clamping means," feeding unit 20 hereinafter called "feeding means," and bond unit 22, hereinafter called "bonding means." The combination of tooling base 16, clamping 18, feeding means 20 and bonding means 22 is referred to as "tooling system 64" which bonds pre-twisted wire to a workpiece and routes said pre-twisted wire. Each unit or element of tooling system 64 is under computer control and will be discussed, subsequently, in further detail. As is pictured in FIG. 2 and can be seen clearer in FIG. 7b, all tooling elements of tooling system 64 operate with respect to a single reference point which is positioned on a center line passing through pictured loop 66, (FIG. 7b). In addition, the entire tooling system 64 rotates about a center line through this point.

As is mentioned previously, tooling base 16 (FIG. 2) is the support for clamping means 18, feeding means 20 and the bonding means 22. Spindle 68 connects tooling base 16 to carriage housing 48 and allows rotation of the tooling base (FIG. 1). The lower surface of tooling base 16 has a plurality of radial channels (not shown) spaced around the circumference of said tooling base. The purpose of these radial channels is to allow proper alignment between the elements of the tooling system.

Figure 7C:
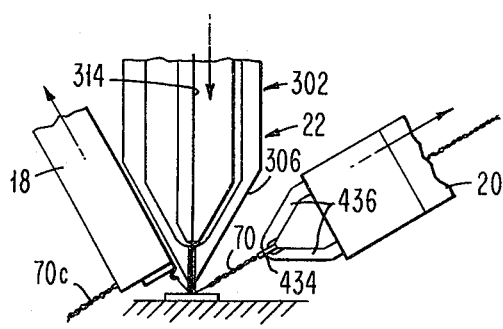
FIG. 7c shows the bonding tool bonding the wires to the workpiece.
Figure 8:
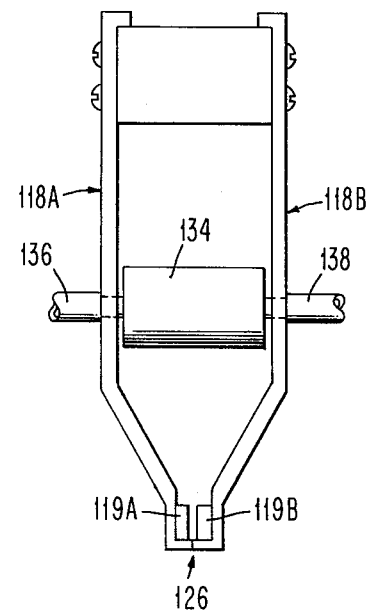
FIG. 8 is a front view of the receiving clamp.
Figure 9:
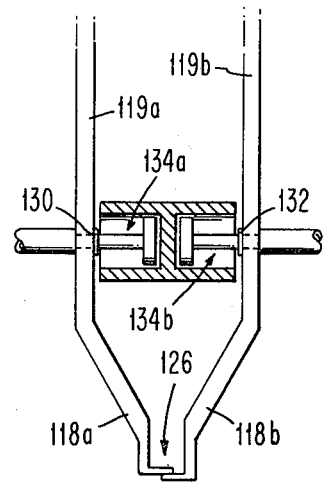
FIG. 9 shows the receiving clamp with piston adders.

Still referring to FIG. 2 and FIG. 7b, is shown, clamping means 18 for receiving pre-twisted wire 70, from feeding means 20 and clamping said pre-twisted wire at a leading node. Clamping means 18 in combination with feeding means 20 opens loop 66 in pre-twisted wire 70 so that bonding means 22 can bond each wire to bond sites on workpiece 26. Clamping means 18 is a scrap removal tool analogous, in some respect, to the one described in the cited Hazel patent. Basically, clamping means 18 has a clamp housing means 102 which connects the clamping means to the tooling base via a L-shaped connector 110. The upper end of biasing means 104 is attached to said housing means while the lower end is attached to the upper section of receiving jaws 118 (not shown) in FIG. 2. Biasing means 104 normally bias the receiving jaws in a direction away from the workpiece (FIG. 7c). Although the biasing means, as disclosed, is a spring, this should be regarded as illustrative only and not limiting the scope of the invention in any way; since equivalent biasing means can be selected by persons skilled in the art. A pair of spaced linear bearing shafts 106 and 108, respectively, is connected to said clamp housing means. The upper end of said shafts are connected to clamp housing 102 by connector 112. The lower ends of said shafts are connected to clamp housing 102 by another connector 114. Receiving jaws 118, only the side view of the receiving jaws is shown in FIG. 2 with a front view of said jaws shown in FIG. 8 and FIG. 9, is interconnected by bearing block 102 to a four-bit conventional piston adder 122 and 124. Another bearing block 128 is interconnected to the upper section of receiving jaws 118 and rides along shaft 108. Piston adders 124 and 122 are joined together on the actual machine. However, for illustration purposes, piston adders 122 and 124 are shown as separate units in FIG. 2. Basically, a piston adder is a combination of at least two air cylinders. By admitting air into the piston chamber, a load to which the piston adders are attached is moved a finite distance. A similar set of piston adders are disclosed in the IBM Technical Disclosure Bulletin, Vol. 10, No. 12, May 1968. Since piston adders are well known positioning devices, they will not be discussed any further.

Referring now to FIGS. 8 and 9, a front view of receiving jaws 118 of the clamping means 18 is shown. Basically, receiving jaws 118 comprise a pair of elongated spring members 118a and 118b. Rubber pads 119a are affixed to member 118a and rubber pads 119b are affixed to member 118b. The upper sections of members 118a and 118b are parallel and the lower portion tapered inwardly to form tip 126. Only a side view of member 118a is shown in FIG. 2. The elongated members are springs which remain close normally.

In the normally closed position, both spring members of tip 126 are overlapped so as to grip pre-twisted wire 70. In the open position, both spring members of tip 126 are pushed apart. As will be explained subsequently, there is an intermediate position between close and open whereby tip 126 is slightly open so as to free pre-twisted wire 70, thereby allowing the feeding means 20 to reverse the relative position of the ground or signal wire. A two-bit piston adder 134 (FIGS. 8 and 9) is attached to members 118a and 118b. Air inlet 136 and 138 supply air to the cylinders of the piston adders. As can be seen in FIG. 9, bit 134a of the two-bit piston adder 134 is attached to member 118a via retaining ring 130. The stroke of the piston of bit 134a is enough to open the jaws of clamping means 18 and accept pre-twisted wire 70. Likewise, bit 134b of the two-bit piston adder 134 is attached to member 118b via retaining ring 132. A stroke of the piston bit 134b partially opens the jaws of clamping means 18 so as to partially free pre-twisted wire 70.

Referring again to FIG. 2, bearing block 120 is affixed to jaw 118a of receiving jaws 118. On the backside of block 120 is a similar bearing block (not shown) which is attached to jaw 118b. As mentioned previously, piston adder 122 and piston adder 124 are connected and the bearing blocks are attached to piston adder 122. By admitting air through air ducts (not shown) into the chamber of the four-bit piston adders, said adders and the bearing blocks move downward on shafts 106 and 108 and allows the selection of many different levels of wiring on the workpiece. As a result of this motion, receiving jaws 118 is moved towards the workpiece (FIG. 7b) against the force of biasing means 104. Likewise, by releasing the air receiving jaws move in a direction away from the workpiece (FIG. 7c). This completes the description of the clamping means.

Still referring to FIG. 2, feeding means 20 feed pre-twisted wire 70 towards clamping means 18. As was mentioned previously, feeding means 20 feed pre-twisted wire 70 from wire spool 14 (FIG. 1) into the jaws of clamping means 18. Pre-twisted wire 70 is pulled directly by feeding means 20 from wire spool 14. As a result of this pulling operation, the overall process is referred to as pull-wire-technology. As a result of this technology, there is no restriction to the length of a net which has to be routed on a workpiece by feeding means 20. Tensioning means 402, 406, and 404 provides pre-twisted wire 70 with necessary tension thus preventing the wire from sagging. Feeding means 20 comprise wire feed support 400 which forms the support means for the other elements of the feeding means. Wire feed housing 400 is an irregular flat piece of metal. The upper rectangular portion 408 of wire feed support is attached to tooling plate 16. The lower irregular shaped portion of wire feed housing 400 has a lower end 410 and a upper end 412. The lower end 410 of wire feed support 400 has two spaced connectors 410a and 410b. The connectors are arranged in the shape of a U with the open end of the U pointing downwards. Wire feed means 414 protrudes between the legs of the U. As is depicted in FIG. 2, only leg 410a of the U is shown, the other leg 410b is on the backside. Similarly, the upper end 412 of the wire feed support 400 has two spaced connectors 412a and 412b. Only 412a is shown in the figure. Connector 412b is on the backside. A first linear shaft 416 has one end attached to leg 410a of the U shaped connector and the other leg attached to leg 412a of the spaced connectors. Similarly, a second linear shaft 418 (not shown) has one end attached to leg 410b and the other end attached to leg 412b of the spaced connectors. A four-bit piston adder 420, similar to the one previously described is attached to wire feed means 414. A bearing block (not shown) is attached to piston adder 420 and rides along shaft 418. Air duct 422 allows air to enter and leave the chamber of the piston adder 420. With piston adder 420 riding on shaft 416 and the bearing block (not shown) riding on shaft 418, wire feed means 414 of feeding means 20 can be moved towards the workpiece or away from the workpiece. (FIGS. 7b and 7c.) On the backside of feeding means 20 is a spring which bias the slidable portion of said feeding means in a direction away from the workpiece. Speed reducer 424 having a 20:1 ratio is interconnected to the two-bit piston adder 426. Air duct 428 supplies air to the piston adder 426. Any small rotation which occurs at the input of the speed reducer due to piston adder 426 is stepped up at the output shaft of the speed reducer. Of course, it will be obvious to persons skilled in the art to substitute equivalent mechanism to replace the speed reducer. For example, a stepping motor, etc., would function in a similar mannter to the speed reducer. Therefore, the use of the speed reducer is only illustrative and does not limit the scope of the invention. The output shaft of speed reducer 424 is interconnected to a 1:1 ratio mating gear 430 and 432. Gear 432 is attached to the upper end of feed tube shaft 434. Feed tube shaft 434 runs the entire length of feeding means 20 and carrier pre-twisted wire 70. The lower end or tip of feed tube shaft 434 protrudes between clamp jaws 436.

Figure 3:
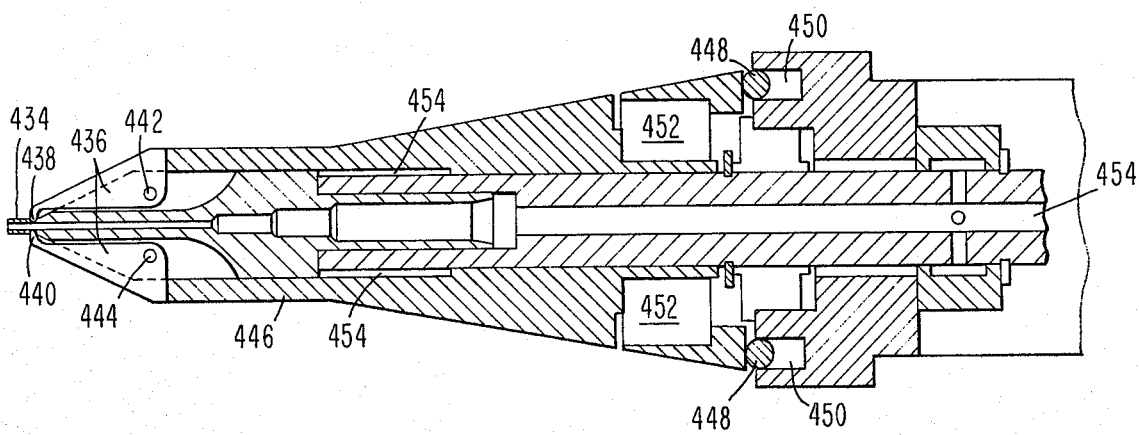
FIG. 3 is a cross-sectional view of the feeding tool along the feed tube axis.

Now referring to FIG. 3, a cross-sectional view of wire feeding means 414 is shown. Wire feed tube 434 has two holes, 438 and 440 on opposite sides of said tube. Clamp jaws 436 fits into these holes and clamps pre-twisted wire 70 which runs internal to feed tube 434. Clamp jaws 436 pivots about pivotal points 442 and 444. Wire clamp pusher sleeve 446 is attached to clamp jaws 436. By applying a force (in a direction towards feed tube tip 434) to pusher sleeve 446, clamp jaws 436 closes thus gripping pre-twisted wire 70. Similarly, releasing the force on pusher sleeve opens clamp jaws 436. A single air cylinder 448 apply the necessary force to pusher sleeve 446. Air inlet 450 supply air pressure to the chambers of air cylinder 448. Pusher sleeve 446 rides on bearing 452 and thus minimize friction. Reset spring 454 reverse bias pusher sleeve away from clamp jaws 436 and assist in opening the jaws. As previously mentioned, feed tube shaft 434 carries pre-twisted wire 70 and runs the length of wire feed means 414. The back of feed tube shaft 454 is attached to gear 432 and as gear 432 rotates feed tube 434 together with pre-twisted wire 70 rotates. This completes the description of the feeding means.

Figure 4:
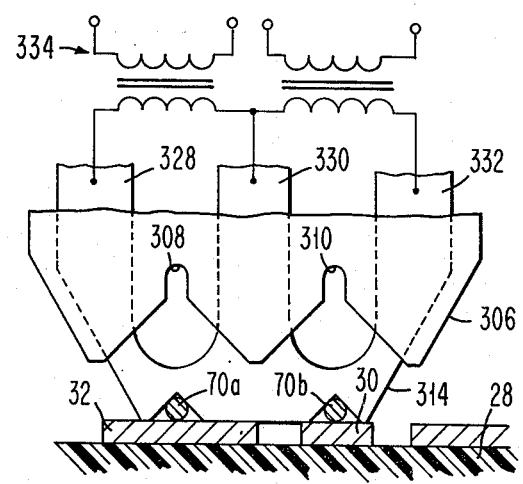
FIG. 4 is a front view of the bonding tool picking up the loop.

Still referring to FIG. 2, an edgewise view of bonding means 22 is shown. The purpose of bonding means 22 is to engage the loop formed in the pre-twisted wire by feeding means 20 and clamping means 18, to establish the wire to wire center line between the ground and signal wires and to bond said wires to respective bond sites on a workpiece (FIG. 7c). Basically, bonding means 22 comprises a bond assembly and a probe assembly 324. Bond assembly 320 includes bond tip 314 and probe assembly 324 includes probe tip 306. An expanded front view of probe tip 306 and bond tip 314 is shown in FIG. 4. In the down position, bond tip 314 has engaged wire 70a and 70b of loop 66 (FIG. 7b) and holds said wires to bond sites 32 and 30, respectively. FIG. 4 also depicts probe tip 306 in its retracted position. Probe tip 306 has spaced recesses 308 and 310, respectively. Loop 66 (FIG. 7b) is engaged by recesses 308 and 310 to establish proper spacing between the wires. The spacing between recess 308 and recess 310 is equivalent to the spacing between the ground and signal pads on the workpiece. Referring again to FIG. 2, probe tip 306 is attached to probe holder 302. Probe holder 302 is attached by screws 312, 326 and 328, respectively, to an insulating block (not shown) which, in turn, is mounted to a vertical moving slide. Probe assembly 324 is attached to a single air cylinder, hereinafter referred to as "first moving means" (not shown). When air is applied to said first moving means, probe assembly 324 raises and lowered by gravity when air is removed from said first moving means. Probe assembly 324 is electrically insulated from bond assembly 320.

Still referring to FIGS. 2 and 4, bond tip 314 is attached to bond tip holder 316. Bond tip holder 316 is attached by plastic screw 304 to an insulating block (not shown). The insulating block, in turn, is mounted to a vertical moving slide. A housing support means on the backside of bonding means 22 attaches the bond assembly 320 and the probe assembly 324 to tooling plate 16. The insulating block and attached elements are spring loaded in the down position to adjust bonding pressure. A second air cylinder (not shown) pushes bond assembly 320 in a direction away from the workpiece when the computer program issues an appropriated command. Likewise, when pressure is released from said second air cylinder, bond assembly 320 lowers into the bonding position.

As mentioned earlier, after loop 66 is formed in the pre-twisted wire, bond tip 314 lowers contact wires 70a and 70b of loop 66 and bonds said wires onto bond sites 32 and 30. The bond tip 314 has input electrodes 328, 330 and 332 with reduce cross-sectional area at the bottom which contacts the wires. As a result, only the bottom of tip 314 is heated when a power pulse is applied to the input electrodes of tip 314. Power supplies 334 and 336, respectively, are interconnected to bond tip 314. Electrode 330 is the common return for electrode 328 and 332. The power supplies are conventional and, as such, will not be discussed any further. This completes the detailed description of the mechanism.

OPERATION

In operation of the device of the invention, workpiece 26 (FIGS. 1 and 6) is secured in place on work positioning mechanism 12 and a program is started. All of the motions of the individual parts of the assembly is controlled by the program stored in the computer. Platform member 24 moves the workpiece in the X-direction to the position where the first commanded bond position is to be made. Simultaneously, carriage assembly 50 moves tooling base 16 (and attached tools) is the Y-direction to the first commanded bond position. As described previously, all individual elements of the assembly is controlled by program stored in a computer. Also, all tooling elements operate with respect to a single reference point which is the center of pictured loop 66 (FIG. 7b). In addition, the entire tooling system rotates about a center line through this point.

As previously described, pre-twisted wire 70 is pulled or fed directly from wire spool 14, as is needed. As is shown in FIG. 7a, clamping means 18 and bonding means 22 is shown in the home position; while feeding means 20 is shown in a down position with pre-twisted wire 70 protuding from the tip of feed tube 434. In FIG. 7a, clamp jaws 436, of feeding means 20 grips pre-twisted wire 70 and rotates said wire in the direction as shown. This step pre-tightens the wire prior to forming loop 66. By supplying pressurized air to air cylinder 448, clamp jaws 436 are closed thus gripping the pre-twisted wire.

In FIG. 7b, clamping means 18 is shown fully descended and gripping a leading node of pre-twisted wire 70. Clamp jaws 436, of feeding means 20, grips a succeeding node of the pre-twisted wire. Loop 66 is opened by rotating while gripping twisted wire 70 in a direction opposite to the pitch of the pre-twisted wire. Generally, the range of rotation for feeding means 20 (FIG. 7b is from 0° to 720°. This degree range is only illustrative and is not intended to restrict the scope of the invention in any way. As previously mentioned, piston adder 426 is interconnected to speed reducer 424 and the output shaft of speed reducer 424 is interconnected to mating gears 430 and 432. Mating gear 432 is attached to feed tube shaft 434 which contains pre-twisted wire 70. Therefore, by admitting a computer controlled quantity of air into the chamber of piston adder 426, the rotation of feeding means 20 is obtained.

In practice, following the opening of loop 66, by untwisting the wires, it may be determined that the orientation of ground pads 30 and signal pads 32 need to be reversed (i.e., the positioning of the signal pad to the right or left of the ground pad) due to product or workpiece factors. This is achieved by releasing receiving jaws 118 of clamping means 18; so as to free pre-twisted wire 70 but not to lose said wire. Receiving jaws 118 are released by applying pressure to bit 134a of two-bit piston adder 134. A controlled quantity of air is then admitted into the chamber of piston adder 426, thereby rotating feeding means 20 from 0° to 180°. By rotating feed means through 180°, the relative position of the ground and signal wire is reversed so as to align each wire with the proper ground or signal pad on the workpiece.

Positioning mechanism 12 is then raised along the Z-axis to the predetermined bonding height. Probe means 302 under the control of an air cylinder (i.e., air is removed from the cylinder) descends by gravity and tips 308 and 310, (FIGS. 7b and 7c) picks up loop 66 to establish wire spacing and straightness. By applying air to the air cylinder, probe means 302 is raised. At this point, pressure is released from the air cylinder of bond assembly 320 and bond tip 314 lowers between probe 306 (FIGS. 7c and FIG. 4) picking up wires 70a and 70b of loop 66 for bonding unto soldier pads 32 and 30, respectively. A power pulse having a time-and-temperature-controlled thermal cycle is applied to the bond tip 314. The pulse is such that the initial part of the cycle is at a high level and relatively short duration so as to melt the insulation from the wire and cause the soldier to commence to flow. During the subsequent longer part of the cycle, the level of the power pulse is reduced leaving the soldier in a wettable condition for effectuating the bond between the bare portion of the wire and the workpiece. Pressure is then released from the piston adder of receiving jaws 118 so as to close said jaws with wire 70 (FIG. 7c). Clamping means 18 is retracted in the direction shown and as described above, so as to break of scrap end 70c of pre-twisted wire 70. The clamp jaws are then opened by applying pressure to the piston adder and the scrap wire is removed. Bond point 36 (FIG. 6) is then tested for strength by lowering the position mechanism containing the workpiece a predetermined distance along the Z-axis, while feeding means 20 still grips the wire, thereby applying a known force to the bonded joint. The clamp jaws 436, of feeding means 20, are then released and the positioning mechanism with the workpiece is further lowred along the Z-axis to the run level.

Feeding means 20 then routes pre-twisted wire 70 through the channels of wire guide 42 (FIG. 6) to a first turning point A. By rotating tooling base 16, (FIGS. 1 and 6) the pre-twisted wire is secured in an orderly geometric pattern around posts 44. The routing is then continued to the second bond point 38 where bonding and testing steps similar to those previously described are performed. The process further continues until the net is completed at point 40. Although a single net is shown in practice, a plurality of nets would be on a workpiece. This completes the description of the operation of the device.

In addition to the problems of the prior art which this device has solved, it affords several other advantages; namely: the device is capable of handling fine wires approaching microscopic size. Also, the high speed at which the device can bond and route an unrestricted length or net of wire. The speed is enhanced by the fact that the device can handle pre-twisted wire while prior art devices cannot handle pre-twisted wire.

While the invention has been particularly shown and described with reference to a preferred embodiment thereof, it will be understood by those skilled in the art that the foregoing and other changes in form and in detail may be made therein without departing from the spirit and scope of the invention.

What is claimed is:

1. In combination with a positioning mechanism for positioning a workpiece, an automatic bonding and routing apparatus for bonding pre-twisted wires to a bond site on said workpiece and routing said pre-twisted wires for bonding on a subsequent bond site on said workpiece, thereby forming a net, said apparatus comprising:

a turret-head;

wire supply means mounted to said turret-head for supplying said pre-twisted wires;

wire feeding means operable connected to said turret-head for feeding said pre-twisted wires from said wire supply means and forming a loop for bonding in said pre-twisted wires;

bonding means operably connected to said turret-head and lying in a plane orthogonal thereto, having a center line parallel to a reference line passing through the center line of said formed loop for engaging said formed loop and bonding said pre-twisted wires to said bond site on said workpiece; and clamping means operably connected to said turret-head for receiving said pre-twisted wires from said wire feeding means and breaking said pre-twisted wires at a point beyond said bond site after bonding thereof, said clamping means comprising a housing support having guide rods affixed to said turret-head and sleeves slidably connected to said guide rods for positioning said clamping means towards or away from said bond site, a pair of receiving jaws operably connected to said housing means for receiving anad clamping said pre-twisted wires, first means operably connected to said receiving jaws for opening said receiving jaws so as to partially release, but yet, retain said pre-twisted wires, second means operably connected to said receiving jaws for opening thereof so as to completely release said pre-twisted wires, and third means attached to said slidable sleeves for controlling the position thereof on said guide rods so as to position said receiving jaws towards or away from said workpiece.

2. Apparatus for bonding pre-twisted wires comprising:

housing support means affixed to a turret-head;

probe means having spaced probe tips operably connected to said housing support means for picking-up a formed loop of said pre-twisted wires for bonding and positioning each wire of said formed loop a predetermined distance onto its respective signal or ground pad on a workpiece;

first moving means attached to said housing support means for moving said probe means towards or away from said workpiece;

first biasing means attached to said housing support means for biasing said probe means away from said workpiece;

bond tips attached to said housing support means positioned between said spaced probe tips for bonding said formed loop of said pre-twisted wires to said signal pad and said ground pad on said workpiece;

second moving means attached to said housing support means for positioning said bond tips toward or away from said workpiece;

second biasing means affixed to said housing support means and said bond tips for biasing said bond tips away from said workpiece; and means for applying a thermal pulse to said probe means, said thermal pulse having a controlled thermal cycle so that insulation is melted from said formed loop of said pre-twisted wires and so that solder on said signal pad and said ground pad on said workpiece is melted thereby bonding said formed loop of said pre-twisted wires to said signal pad and said ground pad.

3. Apparatus for feeding pre-twisted wires comprising:

a wire feed unit;

a wire feed housing support means having guide posts with slidable sleeves thereon for supporting and positioning said wire feed unit;

biasing means affixed to said wire feed housing support means for biasing said wire feed unit away from a workpiece;

moving means for positioning said slidable sleeves and said wire feed unit on said guide posts;

first means for rotating said wire feed unit thereby reversing the relative position of said pre-twisted wires when said pre-twisted wires are not aligned with an appropriate bond site; and second means for rotating said pre-twisted wires in a direction opposite to the pitch of said pre-twisted wires so as to form a loop therein.

* * * * *